United States Patent

[11] 3,625,749

[72] Inventors Satoshi Yoshioka
Nishinomiya-shi;
Shigetoshi Takayanagi, Kyoto, both of Japan
[21] Appl. No. 627,407
[22] Filed Mar. 31, 1967
[45] Patented Dec. 7, 1971
[73] Assignee Matsushita Electronics Corporation
Osaka, Japan
[32] Priority Apr. 6, 1966
[33] Japan
[31] 41/27607

[54] METHOD FOR DEPOSITION OF SILICON DIOXIDE FILMS
5 Claims, 2 Drawing Figs.

[52] U.S. Cl. 117/106 A, 117/201
[51] Int. Cl. C23c 11/08, C23c 11/00
[50] Field of Search 117/201, 106, 106 D; 23/182 V

[56] References Cited

UNITED STATES PATENTS

| | | | |
|---|---|---|---|
| 2,535,036 | 12/1950 | Broughton | 23/182 V |
| 3,087,787 | 4/1963 | Flemmert | 23/182 V |
| 3,203,759 | 8/1965 | Flemmert | 23/182 V |
| 3,233,969 | 2/1966 | Heller et al. | 23/182 V |
| 3,273,963 | 9/1966 | Gunn, Jr. | 23/182 V |
| 3,306,768 | 2/1967 | Peterson | 117/201 X |

OTHER REFERENCES

Powell et al., Vapor Plating, 1955, pages 136 to 142 relied upon.

*Primary Examiner*—Ralph S. Kendall
*Assistant Examiner*—Alan Grimaldi
*Attorney*—Stevens, Davis, Miller & Mosher

ABSTRACT: An improved method for depositing silicon dioxide film on surfaces of substrates, which are stable at temperatures of 730° C. and above, by passing onto the surfaces thereof maintained at 730° C. or above, a gaseous hydrogen-carbon dioxide-silicon tetrafluoride mixture wherein the silicon tetrafluoride concentration is 0.005–0.1 percent by volume and the carbon dioxide concentration is 8 to 92 percent by volume. The film is useful for diffusion-masking films for selective diffusion in fabrication or for passivating films.

Figure 1:
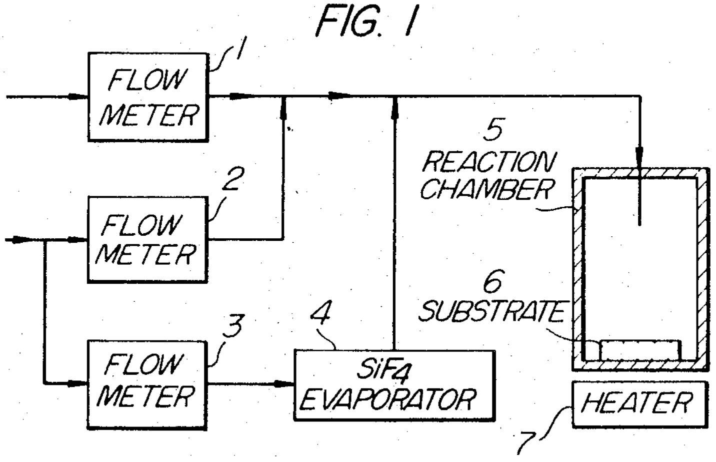

INVENTORS
SATOSHI YOSHIOKA, SHIGETOSHI TAKAYANAGI,

BY Stevens, Davis, Miller & Mosher
ATTORNEYS

METHOD FOR DEPOSITION OF SILICON DIOXIDE FILMS

The present invention relates to a method for depositing silicon dioxide films on the surfaces of semiconductor substrates for semiconductor devices.

In semiconductor devices, it is indispensable to form on semiconductor surfaces dense silicon dioxide films as diffusion-masking films for selective diffusion during the fabrication process thereof or as passivating films for the devices. In semiconductor devices using silicon wafers as the substrates, such films have heretofore been grown according to a so-called "thermal oxidation" process in which silicon films are heated to a temperature of 1,000° C. or above in an atmosphere containing oxygen or steam to thereby oxidize the surfaces of the silicon wafers. Recently, however, semiconductor devices, which are complicated in structure and have high efficiencies and stable properties, have been developed using silicon and other semiconductor materials. In these semiconductor devices, it is required that silicon dioxide films similar in properties, e.g., density and purity, to thermal oxidation films be deposited on the surfaces of the silicon or other semiconductor materials at temperatures far lower than those necessary for the deposition of thermal oxidation films, e.g., at temperatures below 800° C.

The present invention provides a method for producing silicon dioxide films on semiconductor devices which will satisfy the above-mentioned requirements.

Fundamentally, the method of the present invention is based on a known principle of chemical reaction that silicon dioxide is formed by the hydrolysis of a halogen compound of silicon. It has been known that, by application of the above principle, a mixed gas, prepared by adding silicon tetrachloride or silicon tetrabromide to hydrogen and carbon dioxide, is applied onto a silicon or germanium wafer heated to a suitable temperature to deposit a dense silicon dioxide film on the wafer. It has also been known, as a so-called "disproportionation reaction," that, by application of the above principle, a silicon wafer and concentrated hydrofluoric acid sealed in vacuum in a silica tube and the tube heated in an electric furnace having a suitable temperature distribution characteristic, will produce a reaction of the formula:

$$SiO_2+HF \rightleftharpoons SiF_4+2H_2O \qquad (1)$$

in the right-hand direction at the lower temperature portion of the silica tube and in the left-hand direction at the higher temperature portion of the tube to deposit a silicon dioxide film on the silicon wafer placed in the higher temperature portion. However, the silicon dioxide film deposition processes carried out by adoption of said reactions have suffered from such drawbacks as will be mentioned below and have not always been suitable for the industrial production of semiconductor devices. That is, in order for silicon dioxide films, having the required density for diffusion-masking films for selective diffusion during the fabrication process of semiconductor devices or as passivating films for the devices to be deposited according to the former process by use of a mixed gas prepared by adding silicon tetrachloride or silicon tetrabromide to hydrogen and carbon dioxide, the semiconductor wafers employed must be heated to 1,150° C. or above in case silicon tetrachloride is used and to 800° C. or above in case silicon tetrabromide is used. Further, the latter process, carried out through the disproportionation reaction, not only requires complex operations and considerations for mechanical destruction but also suffers from the drawback that the resulting silicon dioxide films are susceptible to contamination and hence is not preferable as an industrial process.

The present inventors have found that a mixed gas comprising silicon tetrafluoride, steam and a carrier gas, such as nitrogen, argon, oxygen, carbon dioxide or hydrogen, may be applied by a flow method onto the surface of a semiconductor heated to 500° C. or above, whereby the hydrolysis reaction of the silicon tetrafluoride is brought about to completely dismiss all the drawbacks which were unavoidable in the above-mentioned conventional processes, and a silicon dioxide film as dense and pure as the thermal oxidation film of silicon can be deposited at a high deposition rate sufficiently utilizable for the commercial production of semiconductor devices. This method has the characteristic that the deposition rate of the silicon dioxide film becomes higher with the increasing temperature of the semiconductor surface and the steam concentration of the mixed gas. On the other hand, however, this method has the following drawback:

That is, when the semiconductor surface temperature or steam concentration is increased in the case where a silicon dioxide film is desired to be deposited on the surface of a relatively easily oxidizable semiconductor material such as germanium or gallium arsenide, the rate of oxidation of the semiconductor surface due to steam becomes even higher with the result that the growth of a pure silicon dioxide film is affected to attain a deposition rate which is lower than in the case where a silicon dioxide film is deposited on the surface of a material which is relatively difficult to oxidize such as silicon. Therefore, the kinds of semiconductor materials which are industrially usable in this method, in which silicon dioxide films are deposited on the surfaces thereof by the hydrolysis of silicon tetrafluoride with steam, are disadvantageously limited.

When, in the above method, a mixed gas of hydrogen and carbon dioxide is used, the feeding of a minimum amount of steam required for the hydrolysis of silicon tetrafluoride is possible, and since no excess steam is present, a semiconductor material such as germanium or gallium arsenide, which is readily oxidized at a temperature of 850° C. or below, scarcely undergoes oxidation. The present inventors continued their studies to improve the process for the hydrolysis of silicon tetrafluoride and found that, when a mixed gas comprising silicon tetrafluoride, hydrogen and carbon dioxide is applied onto a semiconductor surface heated to 730° C. or above, a dense and pure silicon dioxide film is formed according to the formulas:

$$H_2{}^{\circ}CO_2=H_2O+CO \qquad (2)$$

$$SiF_4+H_2O=SiO_2+4HF \qquad (1)'$$

That is, in order for a silicon dioxide film, having the desired density and purity necessary for a diffusion-masking film in the fabrication process of a semiconductor device or a passivating film for the device, to be deposited on a semiconductor wafer by use of a mixed gas comprising silicon tetrachloride or silicon tetrabromide and hydrogen and carbon dioxide, it has heretofore been considered necessary to heat the semiconductor wafer to a temperature of 1,150° C. or above, or 800° C. or above. However, in accordance with the present method, in which silicon tetrafluoride is used, neither purity nor density of the resulting silicon dioxide are lost even when the temperature of the semiconductor wafer employed is lowered to 730° C. For example, in depositing a silicon dioxide film, by use of silicon tetrabromide, on a semiconductor wafer heated to 800° C., the deposition rate is about 0.5 microns per hour, whereas in the case of the present method in which silicon tetrafluoride is used, it was possible to attain a deposition rate of 1.2 microns per hour, i.e., more than twice the deposition rate of the conventional process. Thus, the deposition rate of a silicon dioxide film in accordance with the present method is markedly high, and the present method is excellent as an industrial process.

According to the studies of the present inventors, it has been found that, when a mixed gas of hydrogen, carbon dioxide and silicon tetrafluoride, in which the silicon tetrafluoride concentration is maintained within the range of 0.005 to 0.1 percent and the carbon dioxide concentration within the range of 8 to 92 percent, is applied onto a semiconductor surface heated to 730° C. or above, a silicon dioxide film as dense and pure as the thermal oxidation film of silicon can be deposited at a deposition rate sufficiently high for industrial purposes. It should be noted here that the percentages used throughout the present specification refer to volume.

Figure 2:
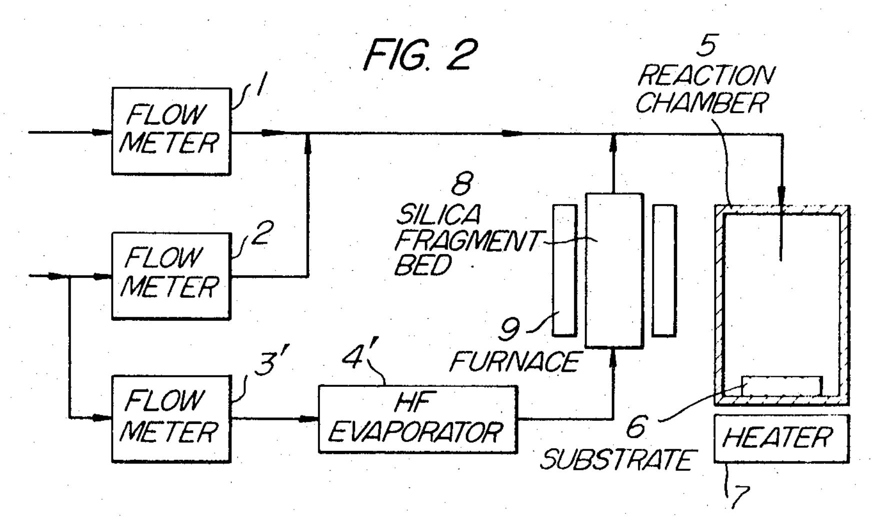

The method of the present invention will be discussed in detail below with reference to the accompanying drawings in which:

FIGS. 1 and 2 are diagrams of the apparatus employed in practicing the method of the present invention.

Referring first to FIG. 1, carbon dioxide passed through a flowmeter 1, hydrogen passed through a flowmeter 2, and silicon tetrafluoride vapor-saturated hydrogen formed by passing hydrogen through a flowmeter 3 and then through a silicon tetrafluoride evaporator 4 made of vitreous silica maintained at a desired temperature are mixed together to form a reaction gas. This reaction gas is applied to a semiconductor wafer 6, the latter being heated to a given temperature in a vitreous silica, reaction chamber 5, whereby a silicon dioxide film is deposited on the wafer surface. In FIG. 2, which shows another embodiment of the present method, silicon tetrafluoride is prepared by introducing hydrogen, which has passed through a flowmeter 3′, into a hydrogen fluoride evaporator 4′ to form a mixed gas having a definite hydrogen fluoride partial pressure, and then by passing the mixed gas through a bed 8 of silica fragments heated to 100° to 200° C. by means of an electric furnace 9. The thus-prepared silicon tetrafluoride is mixed with carbon dioxide, passed through a flowmeter 1, and hydrogen, passed through a flowmeter 2, and the resulting mixed gas is applied to a semiconductor wafer 6 heated to 730° C. or above in a reaction chamber 5. In this case also, the same silicon dioxide film as in the case of FIG. 1 is obtained. According to the above procedures, dense and pure silicon dioxide films can be deposited not only on semiconductor surfaces but also on the surfaces of any solids which are stable at temperatures of 730° C. and above.

The present inventors repeated their researches, from the standpoint of chemical kinetics, on reactions depositing silicon dioxide films from hydrogen, carbon dioxide and silicon tetrafluoride and investigated in detail the relationship between reaction temperatures, reaction gas compositions and the properties of the resulting silicon dioxide films to find the following facts:

The deposition rate of silicon dioxide film increases as the reaction temperature and the silicon tetrafluoride concentration of the reaction gas become higher and the carbon dioxide concentration of the reaction gas becomes closer to 50 percent. In order to attain a deposition rate suitable for industrial purposes, it is necessary to make the reaction temperature 730° C. or above, and to select the silicon tetrafluoride concentration and carbon dioxide gas concentration of the reaction gas from the ranges of 0.005 to 0.1 percent and of 8 to 92 percent, respectively. When the silicon tetrafluoride concentration of the reaction gas is more than 0.1 percent, the carbon dioxide concentration is less than 8 percent or more than 92 percent, or the reaction temperature is below 730° C., side reactions other than the reaction of the aforesaid formula (1)′ becomes marked, with the result that the deposition rate of silicon dioxide film is greatly lowered and the resulting film will not have the required density and purity. Further, in case the silicon tetrafluoride concentration of the reaction gas is less than 0.005 percent, the deposition rate of silicon dioxide film is lowered and becomes unsuitable for industrial purposes.

Based on the above facts, the inventors have found that, in order to deposit at an industrially preferable rate a silicon dioxide film similar in density and purity to a thermal oxidation film of silicon, it is necessary to adopt a reaction temperature of 730° C. or above, and a silicon tetrafluoride concentration and a carbon dioxide concentration of the reaction gas of 0.005–0.1 percent and 8–92 percent, respectively. Further, in case silicon tetrafluoride is formed by passing hydrogen fluoride through a bed of silica fragments and then a silicon dioxide film is deposited, 1 mol of silicon tetrafluoride is formed from 4 mols of hydrogen fluoride. Therefore, it is possible to obtain the same silicon dioxide film as in the case where preformed silicon tetrafluoride is used, by passing hydrogen tetrafluoride corresponding to 0.02–0.4 percent of the reaction gas and maintaining the carbon dioxide concentration at 8–92 percent and the reaction temperature at above 730° C.

The following examples illustrate cases where the present invention was practiced to deposit silicon dioxide films.

EXAMPLE 1

Polished silicon wafers 23 mm. in diameter and 0.2 mm. in thickness were placed at the bottom of a vitreous silica reactor having a diameter of 48 mm. and a height of 400 mm. The reactor was externally heated to 800° C. by use of a tungsten filament heater. A mixed gas having a silicon tetrafluoride concentration of 0.06 percent and a carbon dioxide concentration of 40 percent was prepared, in the same manner as illustrated with reference to FIG. 1, by feeding hydrogen at a rate of 20 cc./min. to a silicon fluoride evaporator charged with solid silicon tetrafluoride maintained at −135° C. to saturate the hydrogen with silicon tetrafluoride and then mixing the silicon tetrafluoride saturated hydrogen with hydrogen fed at a flow rate of 100 cc./min. and carbon dioxide fed at a flow rate of 80 cc./min. The thus-prepared mixed gas was applied for 1 hour, through a silica tube having a diameter of 10 mm., onto the aforesaid silicon wafers heated to 800° C. to deposit thereon silicon dioxide films of 1.2 microns in thickness. The thus-deposited films had a refractive index of 1.453, a density of 2.23 g./cm.$^2$, an etch rate of 3 Angstrom/sec. in fluoric acid at 1.8 mol concentration and a dielectric strength of $5 \times 10^6$ v./cm. $^2$. The films were as dense and pure as thermal oxide films of silicon.

EXAMPLE 2

Hydrogen was fed at a flow rate of 40 cc./min. to a hydrogen fluoride evaporator charged with liquid hydrogen fluoride and maintained at −75° C. to form a gaseous mixture containing hydrogen fluoride in an amount corresponding to 0.12 percent of reaction gas. The hydrogen fluoride and hydrogen gaseous mixture was passed through a Teflon tube having a diameter of 20 mm. and a height of 400 mm. and packed with silica fragments while externally heating the tube to 150° C. by means of an electric furnace to obtain a gas containing silicon tetrafluoride. This gas was mixed with hydrogen fed at a flow rate of 120 cc./min. and carbon dioxide fed at a flow rate of 40 cc./min. to prepare a reaction gas having a silicon tetrafluoride concentration of 0.03 percent and a carbon dioxide concentration of 20 percent. The reaction gas was applied for 1 hour onto germanium wafers heated in a silica reactor to 800° C. to deposit thereon silicon dioxide films of about 0.9 micron in thickness. The thus-obtained films had the same refractive index, density, etch rate in fluoric acid of 1.8 mol concentration and dielectric strength as those of the films obtained in example 1.

Further, a reaction gas of the same composition as above was applied for 3 hours onto germanium wafers heated to 730° C. to deposit silicon dioxide films of about 0.6 micron in thickness. The thus-obtained films were substantially identical in properties with those obtained at a reaction temperature of 800° C.

EXAMPLE 3

A reaction gas having a silicon tetrafluoride concentration of 0.005 percent and a carbon dioxide concentration of 8 percent was prepared in the same manner as in example 2. This reaction gas was applied for 4 hours onto silicon wafers heated to 800° C. to deposit silicon dioxide films of about 6,000 Angstrom in thickness. The thus-obtained films had the same refractive index, density, etch rate in fluoric acid of 1.8 mol concentration and dielectric strength as those of the films obtained in example 1.

In place of the silicon and germanium wafers employed in examples 1, 2 and 3, other semiconductor materials such as gallium arsenide and gallium phosphide, oxide crystals which are difficult to fuse such as aluminum oxide and magnesium oxide, and metals such as nickel and molybdenum were used, and silicon dioxide films were deposited thereon. These films were the same in properties as those in the above examples.

What is claimed is:

1. A method for the deposition of silicon dioxide films comprising the steps of applying onto the surfaces of semiconductor substrate maintained at a temperature of 730°–800° C. a gaseous hydrogen, carbon dioxide, silicon tetrafluoride mixture having a silicon tetrafluoride concentration of 0.005–0.1 percent by volume and a carbon dioxide concentration of 8–92 percent by volume.

2. A method according to claim 1, wherein the semiconductor material is selected from the group consisting of silicon, germanium, gallium arsenide and gallium phosphide.

3. A method according to claim 1, wherein the gaseous mixture of hydrogen, carbon dioxide and silicon tetrafluoride is prepared by feeding hydrogen into an evaporator charged with silicon tetrafluoride and maintained at −135° C. to saturate the hydrogen with said fluoride, and then mixing the silicon tetrafluoride saturated hydrogen with hydrogen and carbon dioxide, wherein gas concentrations of the silicon tetrafluoride and the carbon dioxide are regulated to become 0.06 percent by volume and 40 percent by volume, respectively, and applying the thus-prepared mixed gas onto the surfaces of said semiconductor substrate heated at 800° C. to deposit thereon a thin silicon dioxide film.

4. A method according to claim 1, wherein the gaseous mixture of hydrogen, carbon dioxide and silicon tetrafluoride is prepared by feeding hydrogen to a hydrogen fluoride evaporator maintained at −75° C. to contain hydrogen fluoride in an amount corresponding to 0.12 percent of reaction gas, passing the hydrogen fluoride and the hydrogen through a tube packed with silica fragments and heated to 150° C. to obtain a gas containing silicon tetrafluoride, mixing the thus-obtained gas with hydrogen and carbon dioxide to prepare a reaction gas having a silicon tetrafluoride concentration of 0.03 percent by volume and a carbon dioxide concentration of 20 percent by volume, and applying the mixed reaction gas onto the surfaces of said semiconductor substrate heated at 800° C. to deposit thereon a thin silicon dioxide film.

5. A method according to claim 1, wherein the gaseous mixture of hydrogen, carbon dioxide and silicon tetrafluoride is prepared by feeding hydrogen to a hydrogen fluoride evaporator maintained at −75° C. to form a mixed gas containing hydrogen fluoride in an amount corresponding to 0.12 percent by volume of reaction gas, passing the hydrogen fluoride and hydrogen gas through a tube packed with silica fragments and heated to 150° C. to obtain a gas containing silicon tetrafluoride, mixing the thus-formed gas with hydrogen and carbon dioxide to prepare a reaction gas having a silicon tetrafluoride concentration of 0.005 percent by volume and a carbon dioxide concentration of 8 percent by volume and applying the mixed reaction gas onto the surfaces of said semiconductor substrate heated to 800° C. to deposit thereon a thin silicon dioxide film.

* * * * *

UNITED STATES PATENT OFFICE
CERTIFICATE OF CORRECTION

Patent No. 3,625,749 Dated December 7, 1971

Inventor(s) Satoshi Yoshioka et al.

It is certified that error appears in the above-identified patent and that said Letters Patent are hereby corrected as shown below:

In [32] Priority: change "April 6, 1966" to --April 7, 1966--.

In [31] Priority: change "41/27607" to --41/22607--.

Signed and sealed this 25th day of July 1972.

(SEAL)
Attest:

EDWARD M.FLETCHER,JR.
Attesting Officer

ROBERT GOTTSCHALK
Commissioner of Patents

)RM PO-1050 (10-69)

USCOMM-DC 60376-P69
☆ U.S. GOVERNMENT PRINTING OFFICE : 1969 O—366-334